United States Patent
Kim et al.

(10) Patent No.: US 7,365,021 B2
(45) Date of Patent: Apr. 29, 2008

(54) METHODS OF FABRICATING A SEMICONDUCTOR DEVICE USING AN ORGANIC COMPOUND AND FLUORIDE-BASED BUFFERED SOLUTION

(75) Inventors: Mi-Young Kim, Yongin-si (KR); Sang-Cheol Han, Seoul (KR); Tai-Hyoung Kim, Yongin-si (KR); Jeong-Wook Hwang, Seoul (KR); Hong-Seong Son, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 366 days.

(21) Appl. No.: 11/122,881

(22) Filed: May 5, 2005

(65) Prior Publication Data

US 2005/0260856 A1 Nov. 24, 2005

(30) Foreign Application Priority Data

May 19, 2004 (KR) ...................... 10-2004-0035737

(51) Int. Cl.
*H01L 21/00* (2006.01)

(52) U.S. Cl. ...................... 438/745; 438/704; 438/638; 257/E21.257

(58) Field of Classification Search ................ 438/745, 438/704, 640, 749, 750, 751, 638
See application file for complete search history.

(56) References Cited

U.S. PATENT DOCUMENTS

| | | | | |
|---|---|---|---|---|
| 5,968,848 A | * | 10/1999 | Tanabe et al. | 438/745 |
| 6,424,039 B2 | * | 7/2002 | Wang et al. | 257/750 |
| 6,433,842 B1 | | 8/2002 | Kaneko et al. | 349/43 |
| 6,638,851 B2 | | 10/2003 | Cowley et al. | 438/623 |
| 6,861,347 B2 | | 3/2005 | Lee et al. | |
| 2002/0173143 A1 | | 11/2002 | Lee et al. | |
| 2003/0114014 A1 | | 6/2003 | Yokoi et al. | 438/745 |

FOREIGN PATENT DOCUMENTS

| | | |
|---|---|---|
| JP | 2001-166336 | 6/2001 |
| JP | 2002-169305 | 6/2002 |
| JP | 2003-114539 | 4/2003 |
| JP | 2003-124309 | 4/2003 |
| KR | 2000-0045328 | 7/2000 |
| KR | 2001-0008574 | 2/2001 |
| KR | 2002-0088399 | 11/2002 |
| KR | 2002-0096678 | 12/2002 |

\* cited by examiner

*Primary Examiner*—Michael Lebentritt
*Assistant Examiner*—Reema Patel
(74) *Attorney, Agent, or Firm*—Mills & Onello LLP

(57) ABSTRACT

Methods are provided for fabricating a semiconductor device that include the steps of: sequentially forming a metal interconnection and a protecting layer on a semiconductor substrate; forming a contact hole on the protecting layer; isolating the contact hole by forming a molding layer and an etching stop layer stacked thereon; forming a sacrificial layer on the etching stop layer so as to fill the contact hole; forming a photoresist layer with an opening so as to expose the sacrificial layer and such that the opening of the photoresist layer aligns with the contact hole; forming a trench in the molding layer to penetrate the sacrificial layer and the etching stop layer; and performing a wet etching on the semiconductor substrate having the trench to remove the photoresist layer and the sacrificial layer, wherein the wet etching step is performed using an organic compound and fluoride ion-based buffered solution.

30 Claims, 11 Drawing Sheets

METHODS OF FABRICATING A SEMICONDUCTOR DEVICE USING AN ORGANIC COMPOUND AND FLUORIDE-BASED BUFFERED SOLUTION

CROSS-REFERENCE TO RELATED APPLICATION

This patent application claims priority from Korean Patent Application No. 10-2004-0035737, filed May 19, 2004, the contents of which are hereby incorporated by reference in their entirety.

BACKGROUND OF INVENTION

1. Technical Field

This invention relates generally to methods of fabricating a semiconductor device, and more particularly, to methods of fabricating a semiconductor device by using an organic compound and fluoride-based buffered solution to perform a wet etching step during the fabrication process.

2. Discussion of the Related Art

Generally, semiconductor devices are being fabricated for the characteristics of high-integration and high-speed in order to satisfy an increasingly demanding semiconductor market. High-integration in a semiconductor device can be realized by simply reducing the design rule of the semiconductor device and by vertically stacking metal interconnections with interlayer insulating layers between them. High-speed in a semiconductor device can be realized by using an interlayer insulating layer having a low dielectric constant and metal interconnections having a low resistance based on reduction of the design rule of the semiconductor device.

However, after deposition of the interlayer insulating layer, the desired high-speed of the semiconductor device still may not be realized if the interlayer insulating layer is damaged by a subsequent process step. For example, in the case that the interlayer insulating layer and a photoresist pattern are sequentially formed on a semiconductor substrate, the subsequent process of removing the photoresist pattern may employ a plasma ashing technique which uses process gases of $H_2$ and He or process gases of. $H_2$ and $NH_3$. Such a plasma ashing technique, however, physically attacks the interlayer insulating layer by using plasma ions to transform a porous Si—O bonding layer to an Si—H bonding layer downward to a predetermined depth from a top surface of the interlayer insulating layer. Thus, the Si—H bonding layer forms a dense layer in a portion of the interlayer insulating layer. This is the reason that the Si—H bonding layer easily reacts with oxygen in the air while the semiconductor substrate is exposed out of the plasma ashing apparatus, thereby being transformed into an oxidation layer that is chemically different from the remaining portion of the interlayer insulating layer. As a result, the dense oxidation layer has a dielectric constant different from that of the interlayer insulating layer, thereby resulting in adversely affecting the high-speed of the semiconductor device.

In one approach to these familiar problems, U.S. Pat. No. 6,638,851 to Andy Cowley, et. Al (the '851 patent), which is incorporated herein by reference, discloses a dual hardmask single damascene integration scheme using an organic low k interlayer dielectric (ILD). According to the '851 patent, the scheme includes sequentially stacking an organic low k interlayer dielectric layer and first and second inorganic hardmask layers on a semiconductor substrate. A photoresist pattern is deposited on the second inorganic hardmask layer, and, by using the photoresist pattern as an etching mask, an etching process is performed on the second hardmask layer. The etching process patterns the second hardmask layer in accordance with an etching ratio compared with the first hardmask layer. After performing such etching process, a plasma ashing technique is applied to the photoresist pattern, thereby removing the photoresist pattern from the second hardmask layer.

However, in carrying out the process of the '851 patent, through the plasma ashing technique, the first hardmask layer may be physically attacked by plasma ions. Furthermore, the plasma ions which pass through the first hardmask layer may also physically attack the organic interlayer dielectric layer. Therefore, this scheme may cause an undesirable increase in the dielectric constant of the organic interlayer dielectric layer owing to the plasma ashing technique.

SUMMARY OF THE INVENTION

According to at least some embodiments of the present invention, there are provided methods of fabricating a semiconductor device by using an organic compound and fluoride-based buffered solution in order to perform a wet etching process on a semiconductor substrate having a low k molding layer and a photoresist pattern stacked thereon, thereby minimizing a physical attack on, and resulting damage to, the low k molding layer under the photoresist pattern.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts or elements. In the drawings.

DETAILED DESCRIPTION OF THE INVENTION

Figure 1:
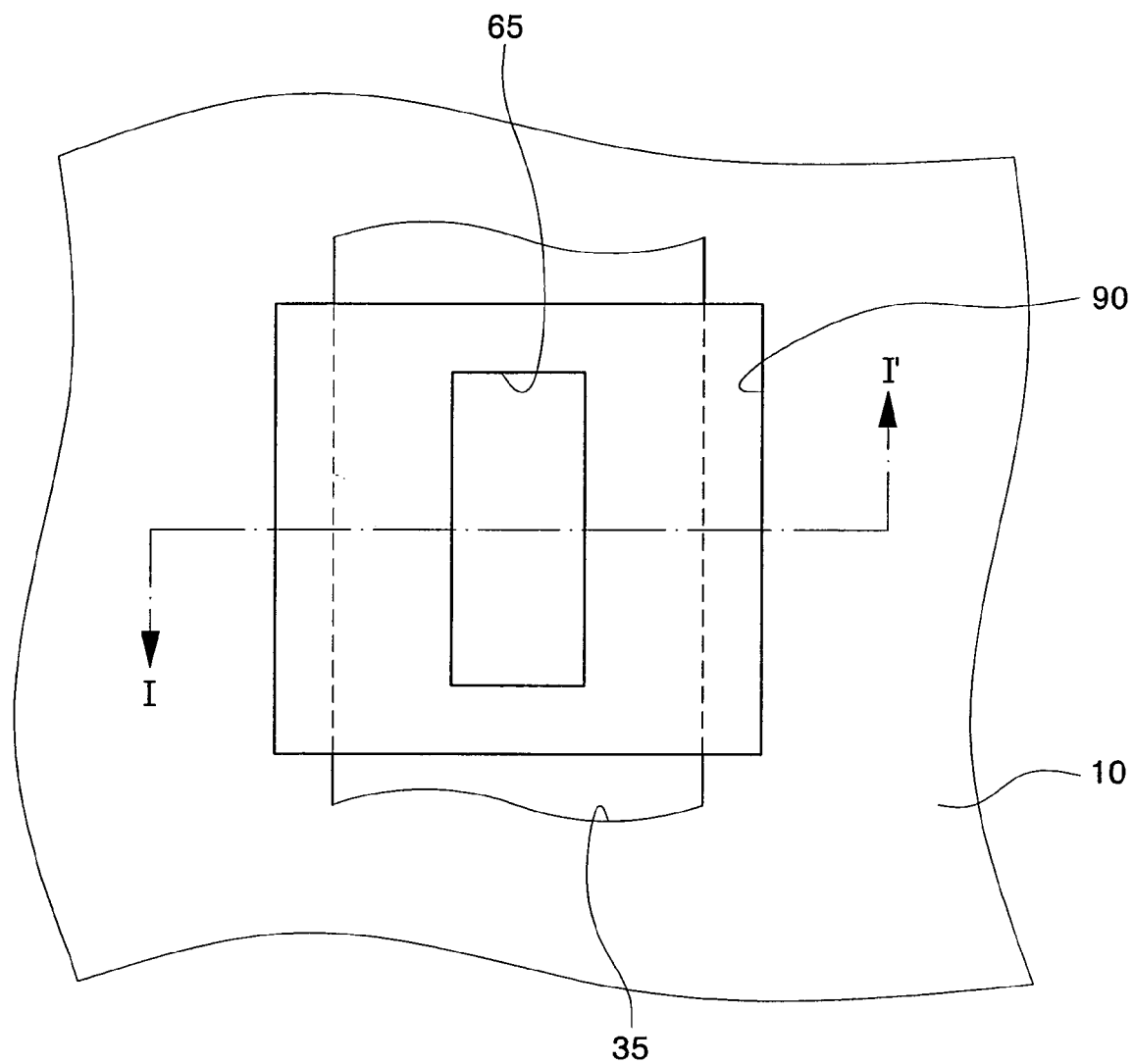
FIG. 1 is a schematic layout or planar view of a semiconductor device according to an embodiment of the invention; and, FIGS. 2 through 12 are schematic sectional views of a semiconductor device taken along line of I-I' of FIG. 1 illustrating a method of fabricating a semiconductor device in accordance with this invention.

FIG. 1 is a schematic layout of a semiconductor device according to an embodiment of the invention, and FIGS. 2 through 12 are schematic sectional views taken along line of I-I' of FIG. 1 illustrating a method of fabricating a semiconductor device in accordance with this invention.

Figure 2:
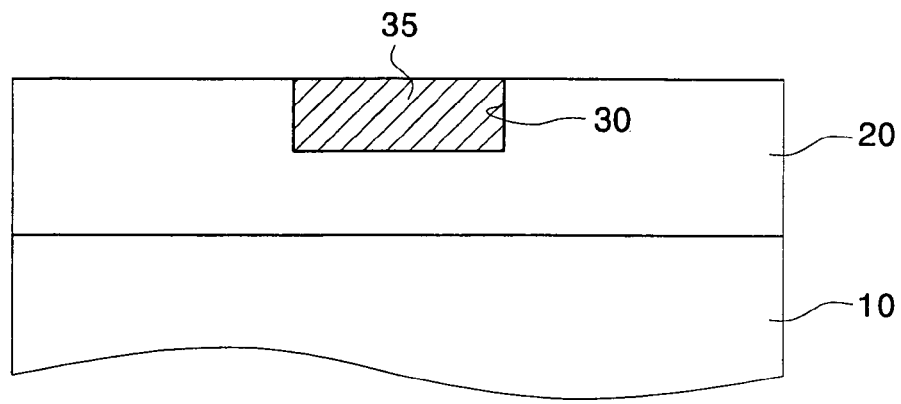
Figure 3:
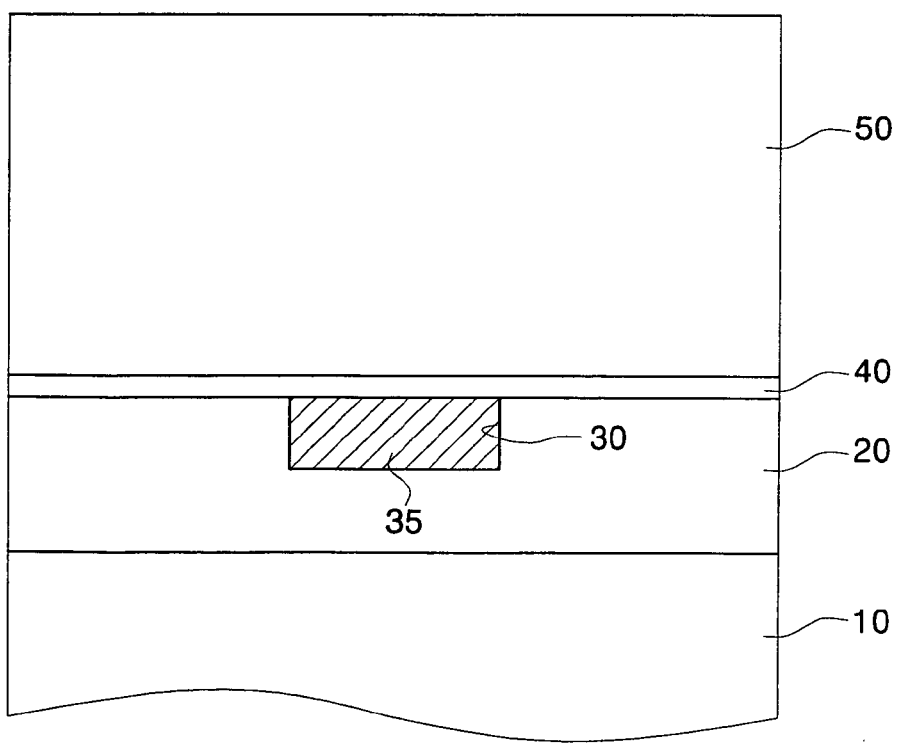

Referring to FIGS. 1 through 3, an interlayer insulating layer 20 is formed on a suitable semiconductor substrate 10, and a groove 30 is formed in the interlayer insulating layer 20. A metal interconnection 35 is formed to fill the groove 30. In some invention embodiments, the metal interconnection 35 is preferably formed of copper (Cu). In other invention embodiments, however, the metal interconnection 35 may be formed of any metal having a low resistance, including aluminum (Al). In some invention embodiments, the interlayer insulating layer 20 may be formed of an insulating layer having a dielectric constant (k) equal to or higher than 3.0. In other invention embodiments, however, the interlayer insulating layer 20 is preferably formed of an insulating layer having a dielectric constant (k) lower than 3.0.

As seen in FIG. 3, a protecting layer 40 and a molding layer 50 are then sequentially formed on the semiconductor substrate having the metal interconnection 35. The molding layer 50 is preferably formed to have a thickness greater than that of the protecting layer 40. The molding layer 50 is preferably formed of an insulating layer having a dielectric constant (k) lower than 3.0. The molding layer 50 may be formed, for example, by using a silicon oxycarbide (SiOC) material selected from the group consisting of fluorine-doped silicate glass (FSG), coral, aurora, black diamond, SiLK and LKD. The protecting layer 40 is preferably formed of an insulating layer having an etching ratio different from that of the molding layer 50, for example, a silicon carbide 15 (SiC) layer.

Figure 4:
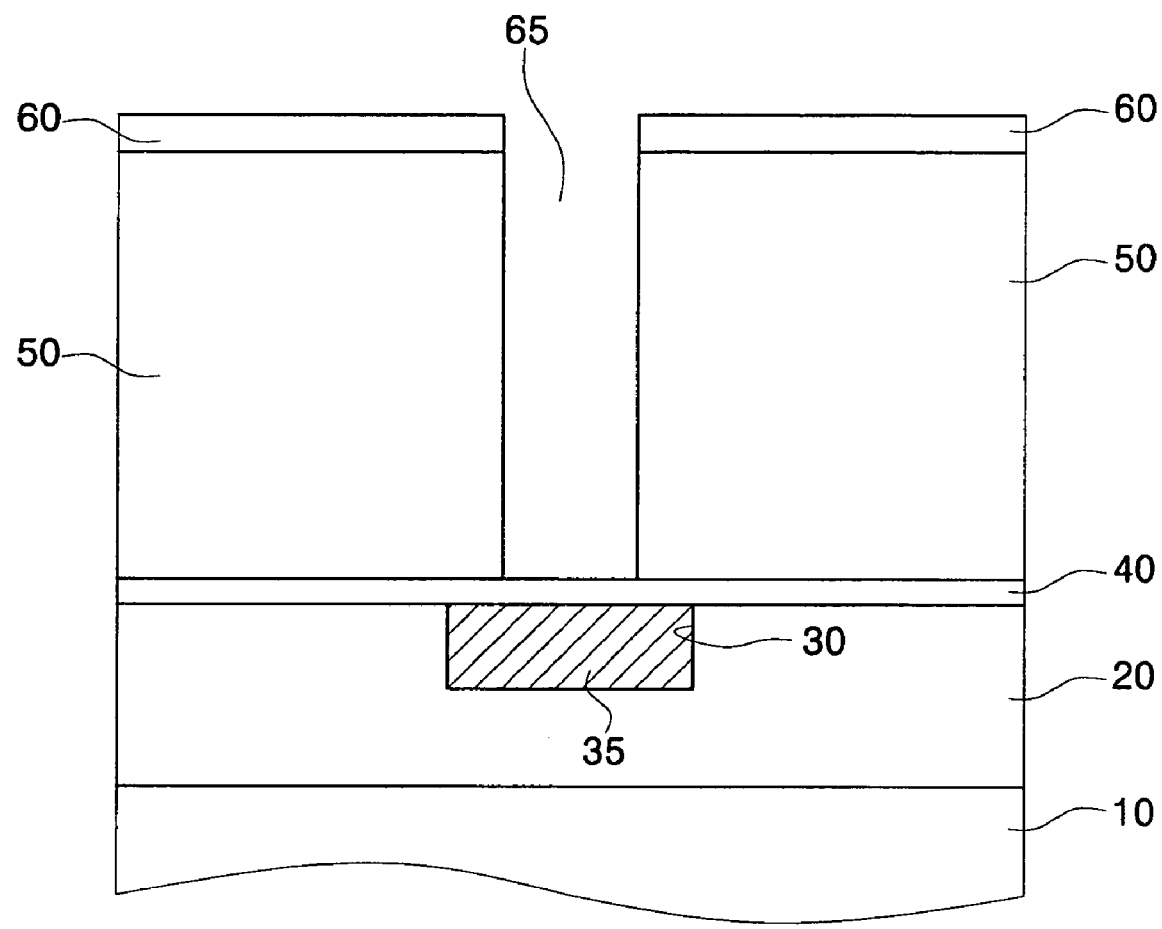
Figure 5:
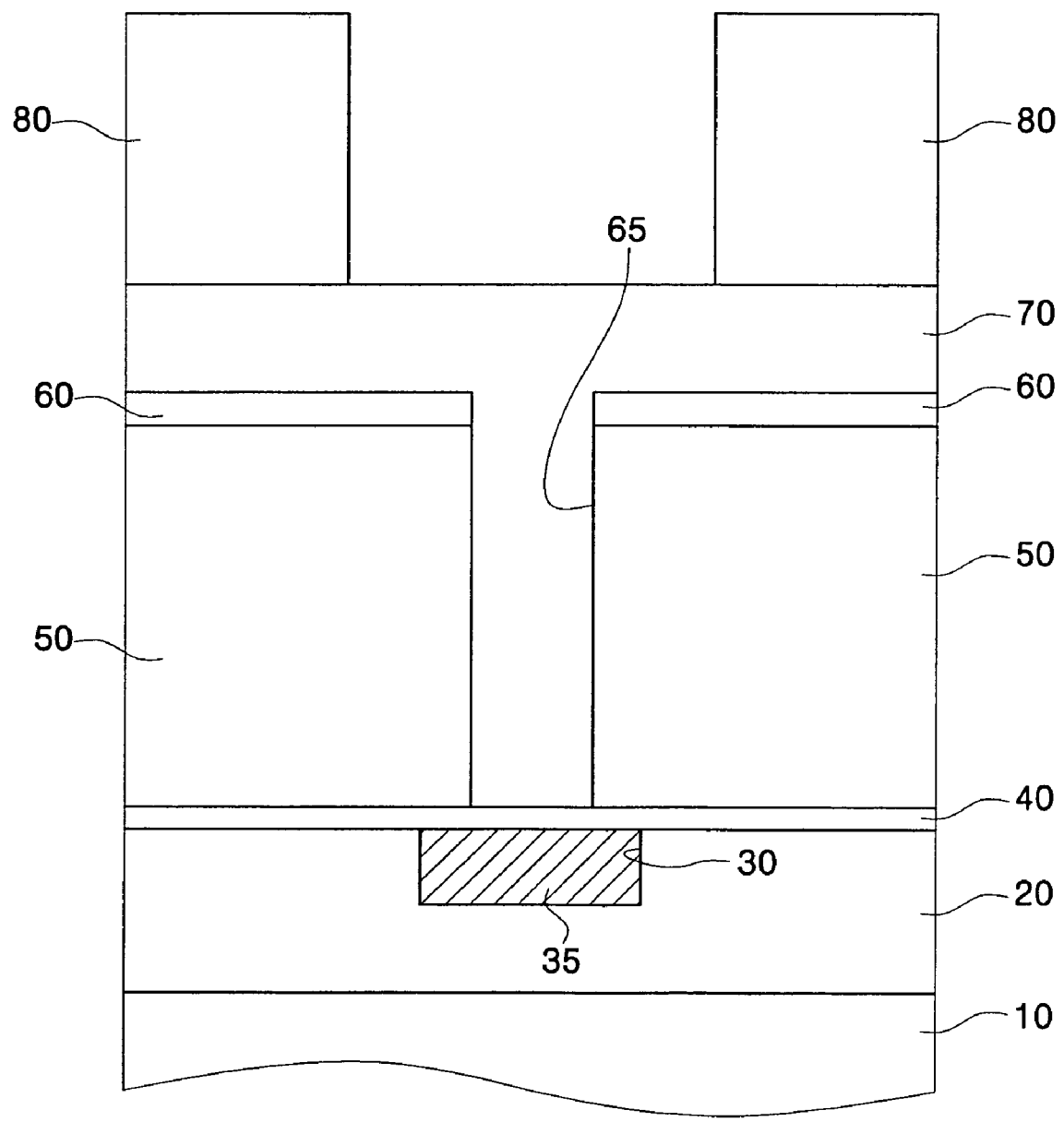

Referring to FIGS. 1, 4 and 5, an etching stop layer 60 is then formed on the semiconductor substrate having the molding layer 50 as illustrated in FIG. 3. A contact hole 65 is formed on the protecting layer 40 so as to penetrate both the etching stop layer 60 and the molding layer 50. The formation of the contact hole 65 may also include or be performed in combination with the steps of: forming a photoresist pattern (not shown) on the etching stop layer 60; performing an etching process on the etching stop layer 60 and on the molding layer 50 by using the photoresist pattern as an etching mask, thereby forming the contact hole 65; and, removing the photoresist pattern from the semiconductor substrate 10. The contact hole 65 is preferably formed to be substantially aligned with the metal interconnection 35 as shown in FIG. 1. The etching stop layer 60 is preferably formed of one or more members selected from the group consisting of HDP, USG, PE-OXIDE, FSG, BPSG, SiOF, SiON and SiN.

Referring now to FIG. 5, a sacrificial layer 70 is next formed on the semiconductor substrate having the contact hole 65, and a photoresist layer 80 is formed on the sacrificial layer 70. The photoresist layer 80 is formed to have an opening. The opening of the photoresist layer 80 and the contact hole 65 are preferably substantially aligned so as to have substantially the same center line or axis, and such that a portion of the top surface of the sacrificial layer 70 is exposed as shown in FIG. 5. The opening in the photoresist layer 80 is preferably formed to have a width or diameter greater than that of the contact hole 65. Alternatively, in some invention embodiments, the opening of the photoresist layer 80 may be formed to have a width or diameter smaller than that of the contact hole 65. The sacrificial layer 70 is formed substantially to fill the contact hole 65 and, concurrently, to also cover the etching stop layer 60. The sacrificial layer 70 is preferably formed of a layer selected from the group consisting of hydrogensilsesquioxane (HSSQ) and methylsilsesquioxane (MSSQ) materials. The sacrificial layer 70 may be formed, for example, by using a flowable oxide (Fox) layer. The sacrificial layer 70 is an insulating layer having a top surface hardened by using a plasma-treatment technique after deposition.

Figure 6:
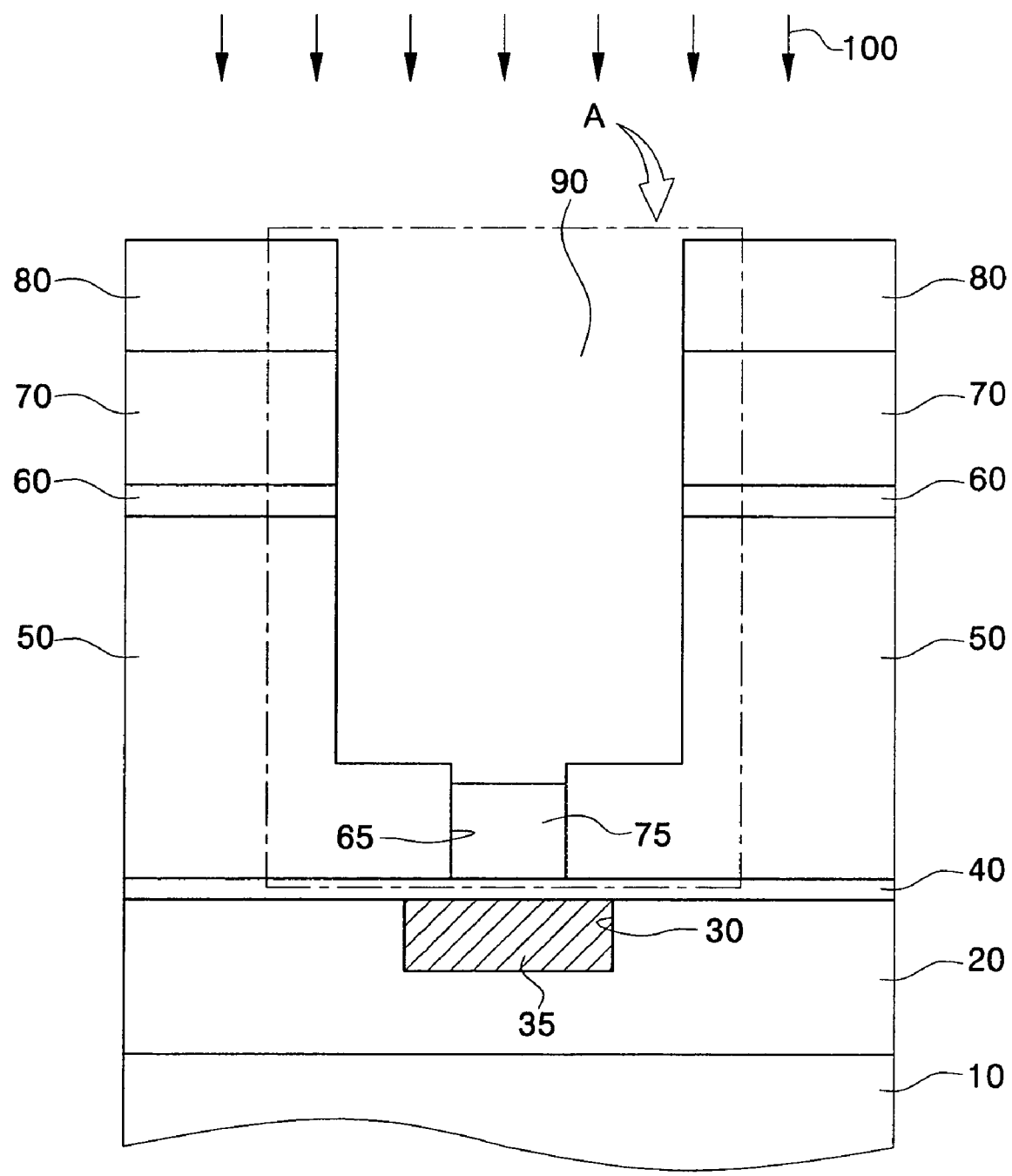
Figure 7:
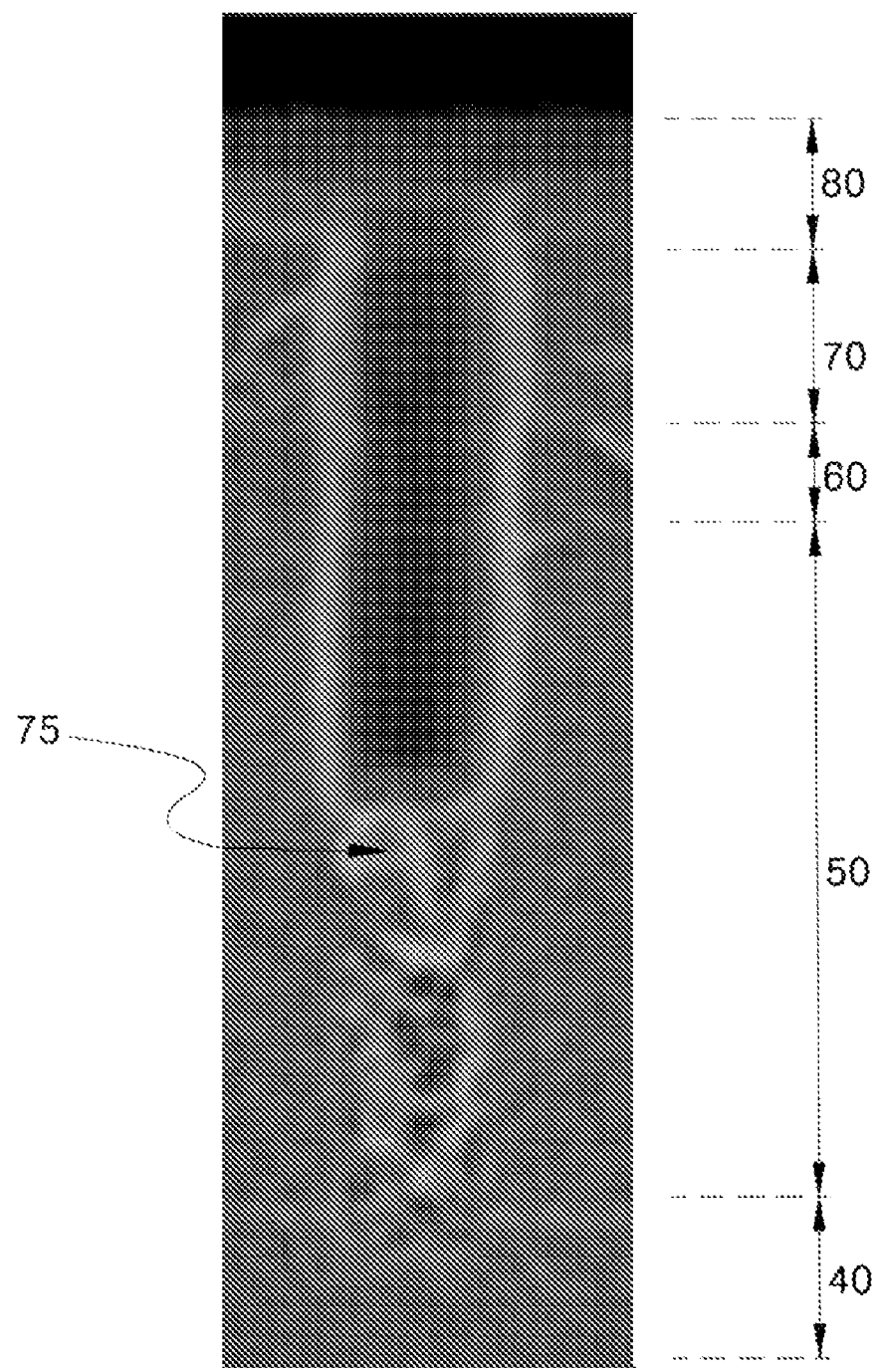

Referring to FIGS. 1, 6 and 7, using the photoresist layer 80 as shown in FIG. 5 as an etching mask, a first etching process (represented by the arrows 100 in FIG. 6) is sequentially performed on the exposed portion of sacrificial layer 70, the underlying portion of etching stop layer 60, and the underlying portion of molding layer 50, thereby forming a trench 90 on the semiconductor substrate 10. The trench 90 is formed in the molding layer 50 to penetrate the sacrificial layer 70 and the etching stop layer 60. In a preferred invention embodiment, the depth of trench 90 may be controlled such that, at this process stage, at least a portion of the sacrificial layer 70 that fills the contact hole 65 is left in place to a predetermined thickness on the protecting layer 40, thereby forming a sacrificial layer pattern 75. The trench 90 preferably has substantially the same width as the opening of the photoresist layer 80. The first etching process 100 is preferably performed by using an anisotropic dry etching technique.

FIG. 7 shows a magnified VSEM profile image of the portion "A" (identified by the broken line rectangle in FIG. 6) of the semiconductor substrate having the sacrificial layer pattern 75. As shown in the image, the trench 90 is isolated by the molding layer 50, the etching stop layer 60, and the sacrificial layer 70 after performing the first etching process 100, and an upper portion of the trench 90 is surrounded by the photoresist layer 80. Further, the trench 90 is formed on the protecting layer 40 so as to expose a top surface of the sacrificial layer pattern 75.

Figure 8:
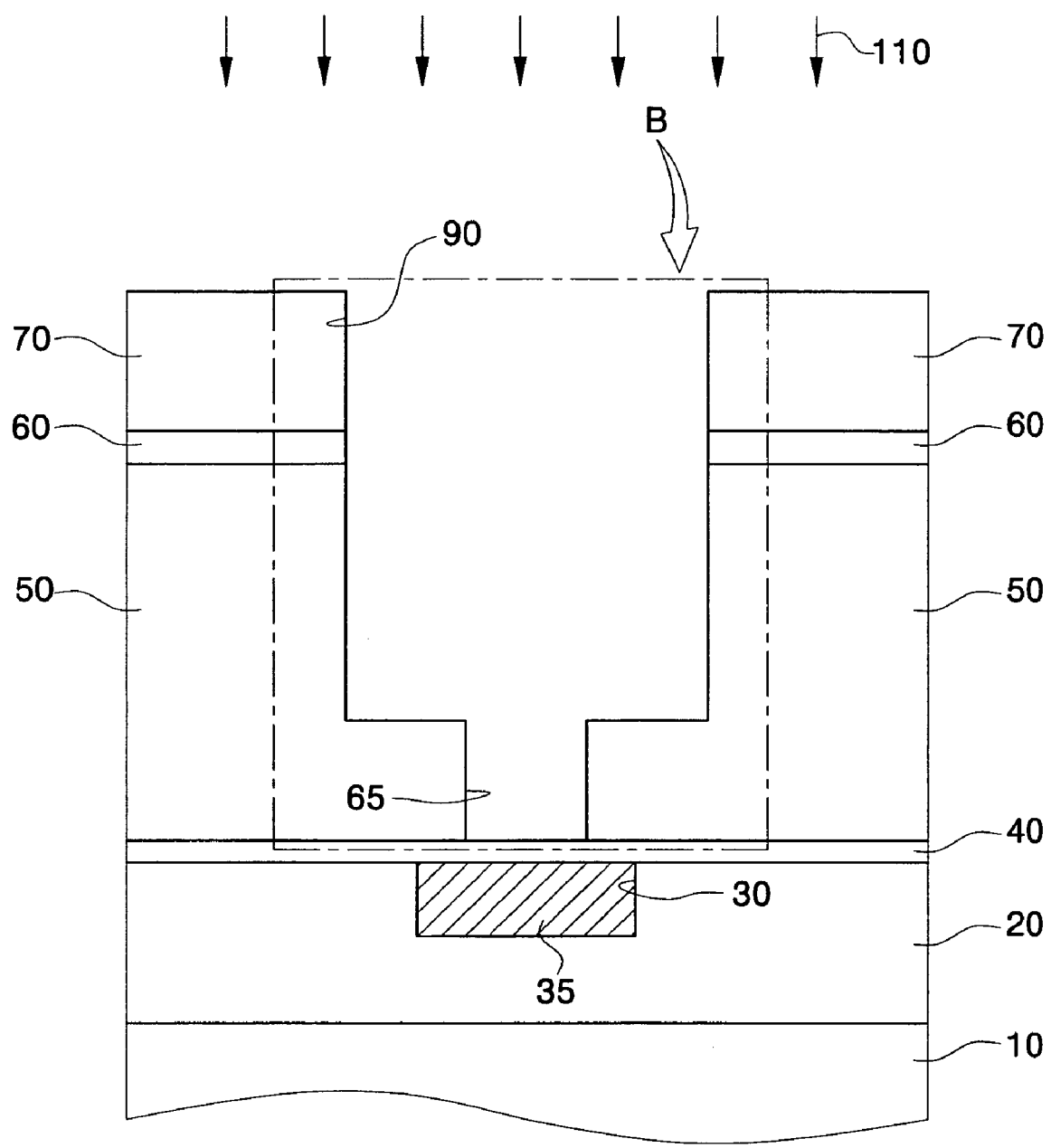
Figure 9:
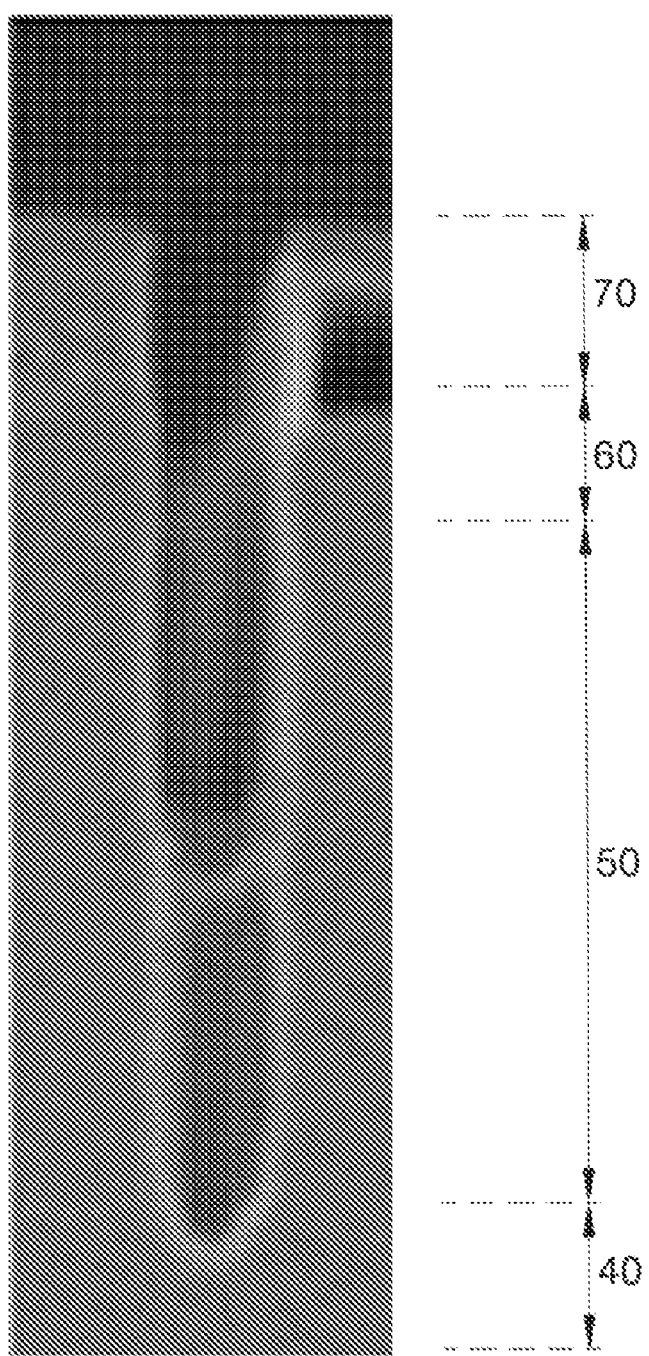

Referring to FIGS. 1, 8 and 9, a second etching process (a wet-etching step represented by the arrows 110 in FIG. 8) is now performed on the semiconductor substrate having the trench 90 as seen in FIG. 6 to remove the photoresist layer 80 and the sacrificial layer pattern 75. This second etching process 110 is preferably performed by using an isotropic wet etching technique. In accordance with the present invention, the second etching process 110 is preferably performed by using an organic compound and fluoride based buffered solution at a suitable temperature and for a sufficient period of time, for example a temperature of about 35° C. for about 5 minutes. The organic and fluoride based buffered solution has an etching ratio less than 1 relative to the protecting layer 40, the molding layer 50 and the etching stop layer 60 as compared with the photoresist layer 80 and the sacrificial layer pattern 75. The sacrificial layer 70 on the etching stop layer 60 is not removed by this treatment step if the top surface of the sacrificial layer 70 of FIG. 5 has been suitably hardened by using the plasma-treatment technique, as described above.

The organic and fluoride based buffered solution is preferably formed of a chemical mixture consisting essentially of suitable proportions of dimethylacetamide (N, N-DMAc), acetic acid ($CH_3COOH$), ammonium fluoride ($NH_4F$), and deionized water (DIW). Alternatively, the organic and fluoride based buffered solution may be formed of a chemical mixture consisting essentially of suitable proportions of a fluoride (F), such as hydrofluoric acid (HF), a buffer oxide etchant (BOE), ammonium fluoride ($NH_4F$), or the like. Further, the organic and fluoride based buffered solution may also be formed of an amine based organic solvent selected from the group consisting of dimethylacetamide (DMAc), tri ethanol amine (TEA), HAD, DGA, PMDETA, or the like, and mixtures thereof. In accordance with this invention, the organic and fluoride based buffered solution is used as a chemical mixture of suitable component proportions and having a fluoride (F) buffer function that is between that of ammonium fluoride ($NH_4F$) and acetic acid ($CH_3COOH$).

FIG. 9 shows a magnified VSEM profile image of the portion "B" (identified by the broken line rectangle in FIG. 8) of the semiconductor substrate after performing the second etching process 110 as described above. As shown in the image, the trench 90 is isolated by the molding layer 50, the etching stop layer 60, and the sacrificial layer 70; and the trench 90 is connected via the contact hole 65 to protecting layer 40. This is because the sacrificial layer pattern 75 which was under the trench 90 (FIG. 6) has all been removed during the second etching process 110. The second etching process 110 is thus performed to expose the top surface of the protecting layer 40.

Referring to FIGS. 1, and 10 through 12, the second etching process 110 may be continued or further performed on the semiconductor substrate having the trench 90 as seen in FIG. 8 to also remove the sacrificial layer 70 on the etching stop layer 60. In accordance with this invention, this further or additional second etching process 110 is preferably performed by using an organic compound and fluoride based buffered solution at a suitable temperature and for a sufficient period of time, for example a temperature of about 35° C. for about 15 minutes. The organic compound and fluoride based buffered solution has an etching ratio less than 1 relative to the protecting layer 40, the molding layer 50 and the etching stop layer 60 as compared with the photoresist layer 80 and the sacrificial layer 70. The second etching process 110 may be further performed to remove the sacrificial layer 70 on the etching stop layer 60, and, concurrently, to remove any remaining residues of the photoresist layer 80 and the sacrificial layer pattern 75.

Figure 10:
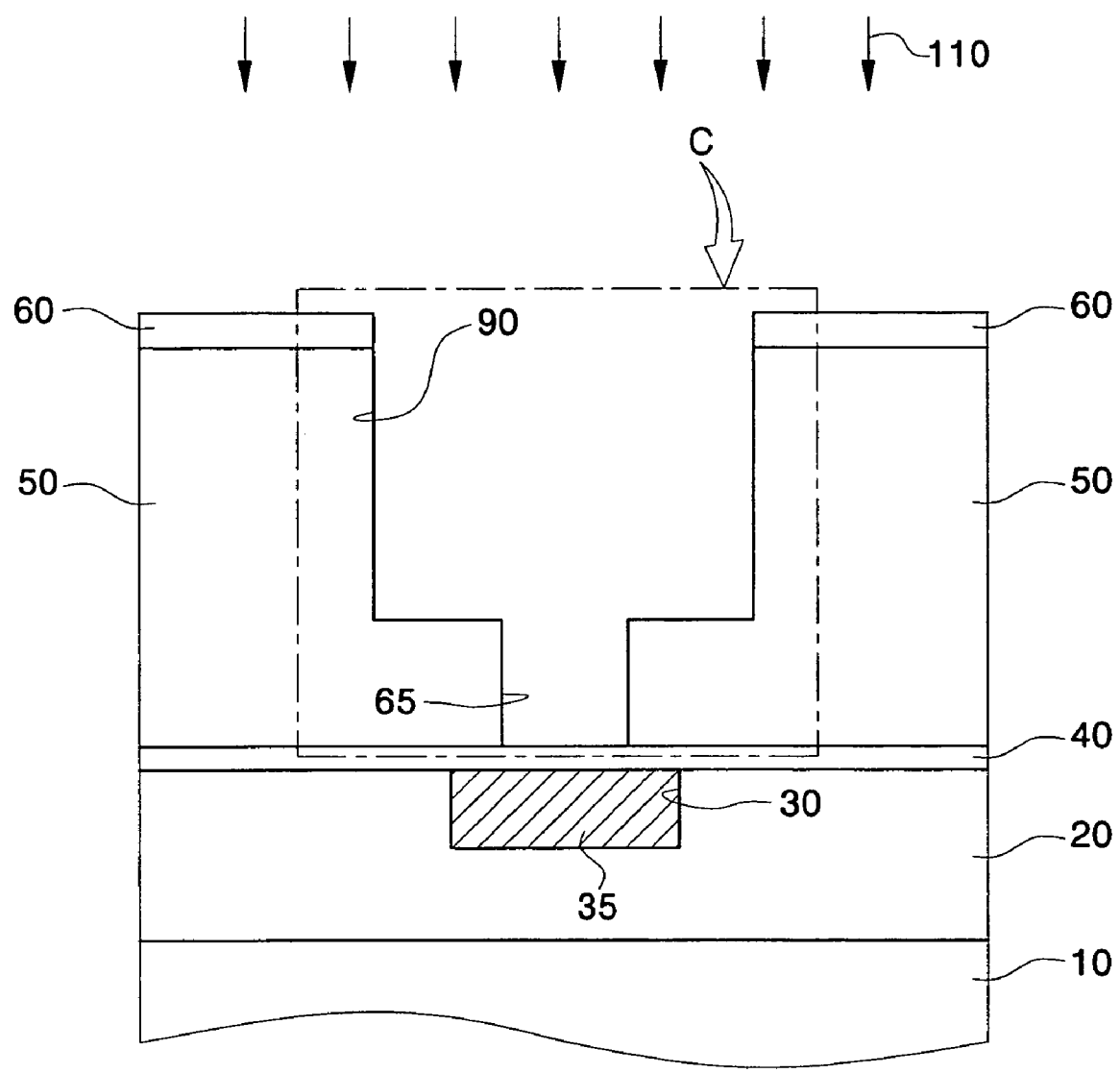
Figure 11:
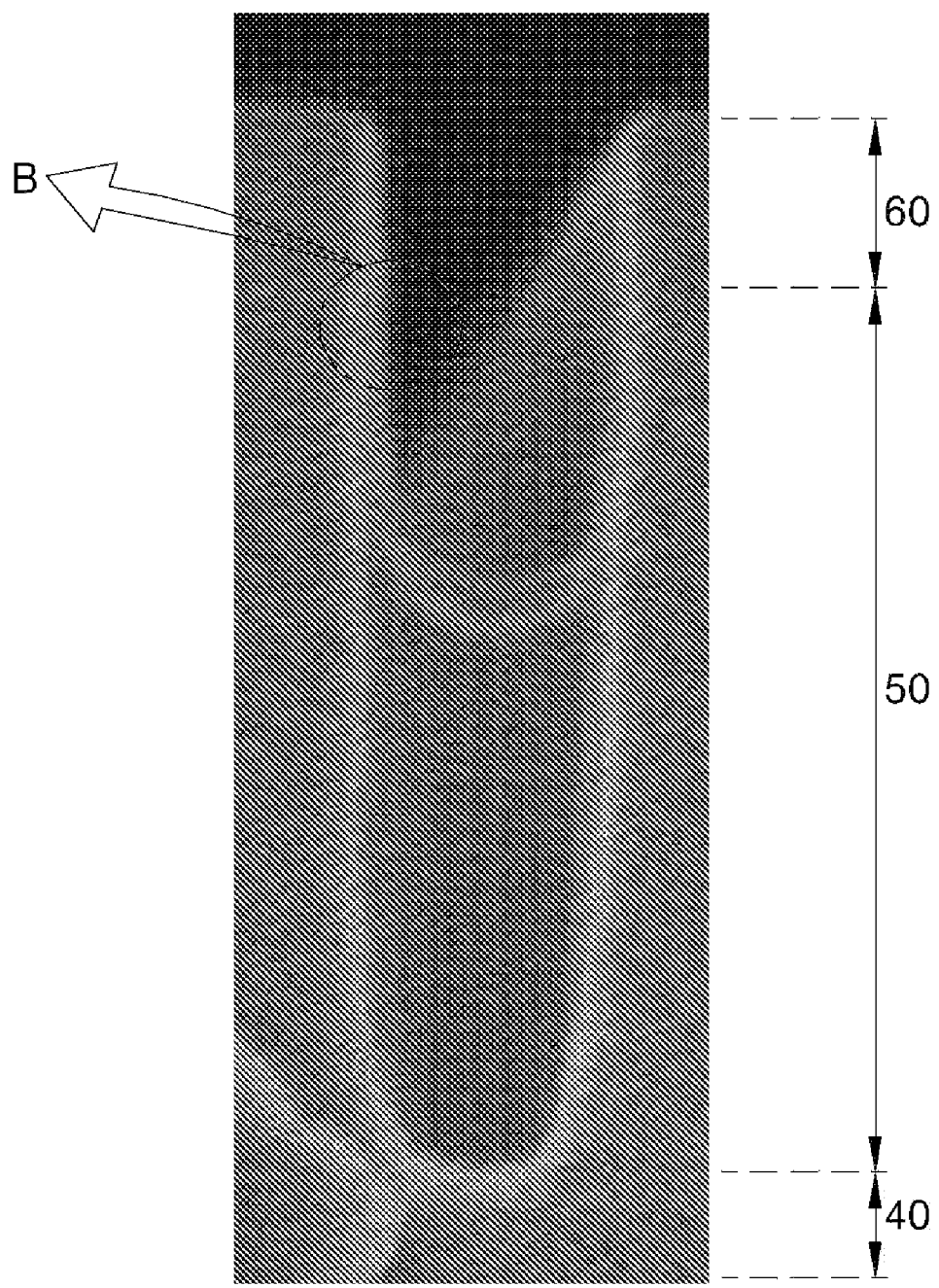
Figure 12:
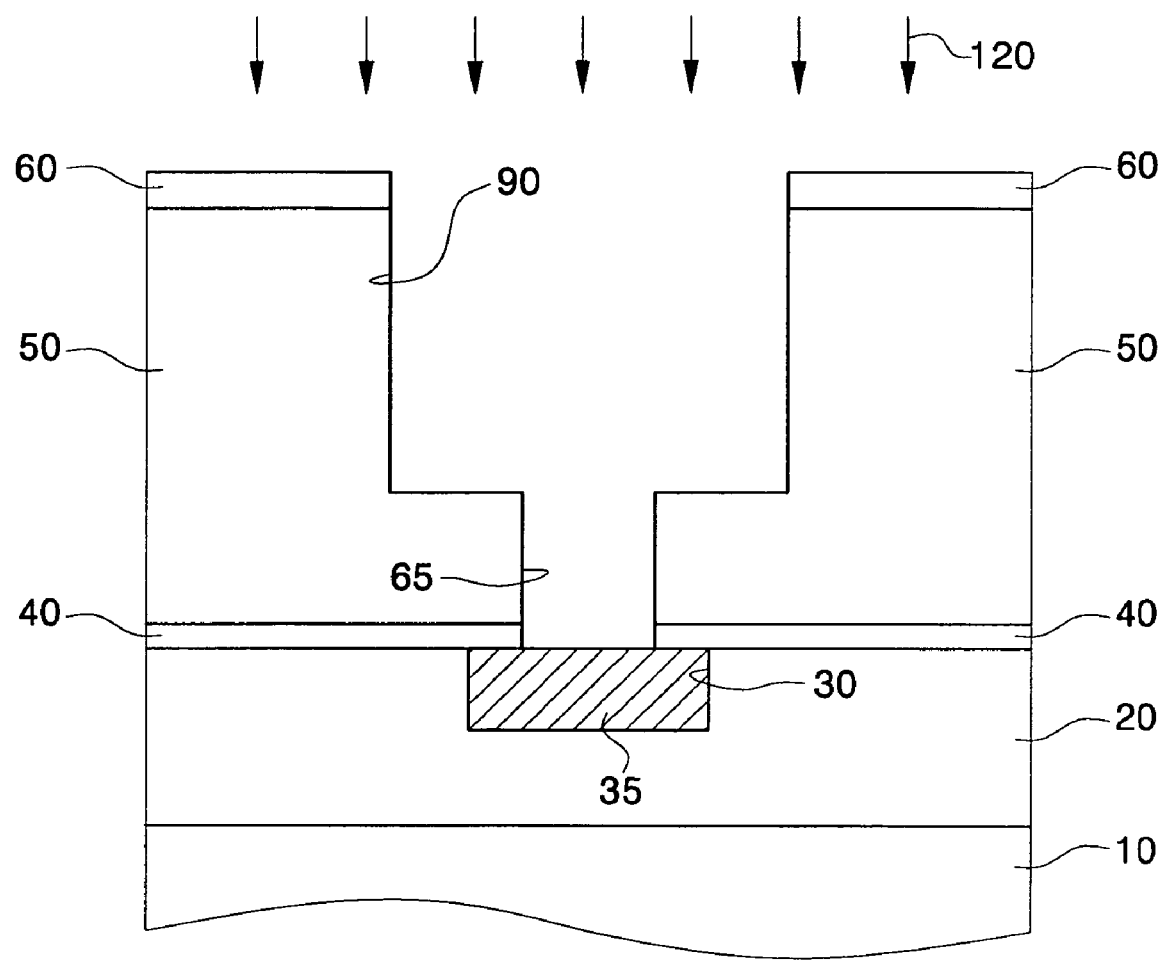

FIG. 11 shows a magnified VSEM profile image of the portion "C" (identified by the broken line rectangle in FIG. 10) of the semiconductor substrate after performing the further second etching process 110 as described above. As shown in the image, the trench 90 is isolated by the etching stop layer 60 and the molding layer 50; and, the trench 90 is connected via the contact hole 65 to protecting layer 40. During the performance of the second etching process 110, since a portion D (FIG. 11) of an interface between the etching stop layer 60 and the molding layer 50 is not etched, the substantially straight-edged shape of the trench 90 under a top surface of the etching stop layer 60 can be maintained as illustrated in FIG. 6. Since the molding layer 50 is not physically damaged during the performance of the second etching process 110 in accordance with this invention, the initial dielectric constant of the molding layer 50 is thus maintained in contrast with the damage and deterioration which occurs when using conventional processing technology. Furthermore, since the etching stop layer 60 and the molding layer 50 are not etched during the performance of the second etching process 110 in accordance with this invention, the initial desirable shape of the trench 90 can be maintained.

A third etching process (represented by the arrows 120 in FIG. 12) may now be performed on the semiconductor substrate 10 as seen in FIG. 10 to remove the portion of the protecting layer 40 beneath the trench 90 and the contact hole 65 so as to expose the metal interconnection 35. This third etching process 120 may be performed, for example, by using an anisotropic dry etching technique.

As described above, according to the invention, there are provided methods of fabricating improved, higher performance semiconductor devices by using an organic and fluoride based buffered solution in the wet etching processing step of the fabrication process to concurrently remove the photoresist pattern and the sacrificial layer pattern. As such, the methods of this invention can minimize a plasma attack to the molding layer to improve the resulting electrical characteristics of a semiconductor device. Further, the methods of this invention can simplify the semiconductor fabrication process and reduce fabrication costs.

Embodiments of the invention will now be described in a non-limiting way.

Embodiments of the present invention provide methods of fabricating a semiconductor device by using an organic and fluoride based buffered solution.

According to some embodiments of the invention, there are provided methods that include sequentially forming a metal interconnection and a protecting layer on a semiconductor substrate. A contact hole is formed on the protecting layer and substantially aligned with the metal interconnection. The contact hole is isolated by a molding layer and an etching stop layer stacked thereon. A sacrificial layer is formed on the etching stop layer so as to fill the contact hole. A photoresist layer having an opening therein so as to expose the sacrificial layer is formed thereon such that the opening of the photoresist layer has substantially the same center line as the contact hole. A first (preferably dry) etching process is performed on the sacrificial layer, the etching stop layer and the molding layer by using the photoresist layer as an etching mask to form a trench on the semiconductor substrate. The trench is formed in the molding layer to penetrate the sacrificial layer and the etching stop layer leaving at least a portion of a sacrificial layer pattern formed inside the contact hole. A second (wet) etching process is performed in accordance with this invention by using the etching stop layer as a buffered layer to concurrently or sequentially remove the photoresist pattern, the sacrificial layer and the sacrificial layer pattern formed inside the contact hole from the semiconductor substrate.

According to the other more specific embodiments of the invention, there are also provided methods that include sequentially forming a copper interconnection and a protecting layer on a semiconductor substrate. A contact hole is formed on the protecting layer and substantially aligned with the copper interconnection. The contact hole is isolated by a molding layer and an etching stop layer stacked thereon. A sacrificial layer is formed on the etching stop layer so as to fill the contact hole. A photoresist layer having an opening therein so as to expose the sacrificial layer is formed thereon such that the opening of the photoresist layer has substantially the same center line as the contact hole. A first (preferably dry) etching process is performed on the sacrificial layer, the etching stop layer and the molding layer by using the photoresist layer as an etching mask to form a trench on the semiconductor substrate. The trench is formed in the molding layer to penetrate the sacrificial layer and the etching stop layer leaving at least a portion of a sacrificial layer pattern formed inside the contact hole. A second (wet) etching process is performed in accordance with this invention by using the etching stop layer as a buffered layer to concurrently or sequentially remove the photoresist pattern, the sacrificial layer and the sacrificial layer pattern formed inside the contact hole from the semiconductor substrate. In accordance with this invention, the second etching process is performed by using an organic compound and fluoride based buffered solution.

What is claimed is:

1. A method of fabricating a semiconductor device comprising the steps of:

sequentially forming a metal interconnection, a protecting layer, a molding layer and an etching stop layer on a semiconductor substrate;

forming a contact hole directly on the protecting layer so as to expose a portion of said protecting layer, wherein said hole is substantially aligned with the metal interconnection and penetrates both the molding layer and the etching stop layer stacked on said protecting layer;

forming a sacrificial layer on the etching stop layer so as substantially to fill the contact hole;

forming a photoresist layer on said sacrificial layer, said photoresist layer having an opening so as to leave exposed a portion of the sacrificial layer, said opening having substantially the same center line as the contact hole;

performing a first etching process on the sacrificial layer, the etching stop layer, and the molding layer using the photoresist layer as an etching mask, thereby forming a trench on the semiconductor substrate, the trench being formed in the molding layer and penetrating the sacrificial layer and the etching stop layer, while leaving a portion of the sacrificial layer inside the contact hole; and performing a second etching process by an isotropic wet etching technique using the etching stop layer as a buffered layer, thereby concurrently or sequentially etching and removing the photoresist pattern, the sacrificial layer and the portion of the sacrificial layer remaining inside the contact hole from the semiconductor substrate using a buffered etching composition that may also contact the protecting layer, molding layer and etching stop layer during the second etching process, further wherein said buffered etching composition comprises an amine-based organic component and a fluoride-based component, and also wherein during etching the buffered etching composition has an etching ratio less than 1 based on the rates at which the buffered etching composition etches the protective layer, molding layer and etching stop layer relative to the rates at which it etches the photoresist layer and the sacrificial layer.

2. The method according to claim 1, wherein the first etching process is performed using an anisotropic dry etching technique.

3. The method according to claim 1, wherein the second etching process is performed at a temperature of about 35° C. for about 5 minutes.

4. The method according to claim 1,
wherein the buffered etching solution consists essentially of a chemical mixture of suitable proportions for etching of dimethylacetamide (N, N-DMAc), acetic acid ($CH_3COOH$), ammonium fluoride ($NH_4F$), and deionized water (DIW).

5. The method according to claim 1,
wherein the buffered etching solution consists essentially of a chemical mixture of suitable proportions for etching of fluoride (F) ion, buffer oxide etchant (BOE), and ammonium fluoride ($NH_4F$).

6. The method according to claim 1,
wherein the buffered etching solution consists essentially of a chemical mixture including a suitable proportion for etching of an amine-based organic solvent selected from the group consisting of dimethylacetamide (N, N-DMAc), tri ethanol amine (TEA), HAD, DGA, PMDETA, and mixtures thereof.

7. The method according to claim 1,
wherein the buffered etching solution provides a fluoride (F) buffer function which has a value between that of ammonium fluoride ($NH_4F$) and that of acetic acid ($CH_3COOH$).

8. The method according to claim 1, wherein the sacrificial layer and the sacrificial layer pattern formed inside the contact hole are formed using a material selected from the group consisting of hydrogensilses quioxane (HSSQ), methylsilses quioxane (MSSQ), and mixtures thereof.

9. The method according to claim 1, wherein the etching stop layer is formed using a material selected from the group consisting of HDP, USG, PE-OXIDE, FSG, BPSG, SiOF, SiON, SiN and mixtures thereof.

10. The method according to claim 1, wherein the molding layer is formed by using a silicon oxycarbide(SiOC) material selected from the group consisting of FSG, Coral, Aurora, Black Diamond, SiLK, L, KD and mixtures thereof.

11. The method according to claim 1, wherein the protecting layer is formed by using an insulating layer that provides an etching ratio that is different from that of the molding layer.

12. The method according to claim 1, wherein the protecting layer is formed by using a silicon carbide (SiC) layer.

13. The method according to claim 1, wherein the sacrificial layer is an insulating layer having a top surface hardened by using a plasma-treatment technique after deposition.

14. The method according to claim 1, wherein the metal interconnection is formed of copper (Cu).

15. The method according to claim 1, further comprising the step of, after performing the second etching process, performing a third etching process on the protecting layer by using the etching stop layer and the molding layer as an etching mask effective to etch the protecting layer and expose a top surface of the metal interconnection.

16. The method according to claim 15, wherein the third etching process is performed by using an isotropic dry etching technique.

17. A method of fabricating a semiconductor device comprising the steps of:
sequentially forming a copper interconnection, a protecting layer, a molding layer and an etching stop layer on a semiconductor substrate;

forming a contact hole directly on the protecting layer so as to expose a portion of said protecting layer, wherein said hole is substantially aligned with the copper interconnection and penetrates both the molding layer and the etching stop layer stacked on said protecting layer;

forming a sacrificial layer on the etching stop layer so as substantially to fill the contact hole;

forming a photoresist layer on said sacrificial layer, said photoresist layer having an opening so as to leave exposed a portion of the sacrificial layer, said opening having substantially the same center line as the contact hole;

performing a first etching process on the sacrificial layer, the etching stop layer, and the molding layer using the photoresist layer as an etching mask, thereby forming a trench on the semiconductor substrate, the trench being formed in the molding layer and penetrating the sacrificial layer and the etching stop layer, while leaving a portion of the sacrificial layer inside the contact hole; and performing a second etching process by an isotropic wet etching technique using the etching stop layer as a buffered layer, thereby concurrently or sequentially etching and removing the photoresist pattern, the sacrificial layer and the portion of the sacrificial layer remaining inside the contact hole from the semiconductor substrate using a buffered etching composition that may also contact the protecting layer, molding layer and etching stop layer during the second etching process, further wherein said buffered etching composition comprises an amine-based organic component and a fluoride-based component, and also wherein during etching the buffered etching composition has an etching ratio less than 1 based on the rates at which the buffered etching composition etches the protective layer, molding layer and etching stop layer relative to the rates at which it etches the photoresist layer and the sacrificial layer.

18. The method according to claim 17, wherein the first etching process is performed using an anisotropic dry etching technique.

19. The method according to claim 17, wherein the second etching process is performed at a temperature of about 35° C. for about 5 minutes.

20. The method according to claim 17, wherein the buffered etching solution consists essentially of a chemical mixture of suitable proportions for etching of dimethylacetamide (N, N-DMAc), acetic acid ($CH_3COOH$), ammonium fluoride ($NH_4F$), and deionized water (DIW).

21. The method according to claim 17, wherein the buffered etching solution consists essentially of a chemical mixture of suitable proportions for etching of fluoride (F) ion, buffer oxide etchant (BOE), and ammonium fluoride ($NH_4F$).

22. The method according to claim 17, wherein the buffered etching solution consists essentially of a chemical mixture including a suitable proportion for etching of an amine-based organic solvent selected from the group consisting of dimethylacetamide (N, N-DMAc), tri ethanol amine (TEA), HAD, DGA, PMDETA, and mixtures thereof.

23. The method according to claim 17, wherein the buffered etching solution provides a fluoride (F) buffer function which has a value between that of ammonium fluoride ($NH_4F$) and that of acetic acid ($CH_3COOH$).

24. The method according to claim 17, wherein the sacrificial layer is an insulating layer having a top surface hardened by using a plasma-treatment technique after deposition.

25. The method according to claim 17, wherein the sacrificial layer and the sacrificial layer pattern formed inside the contact hole are formed using a material selected from the group consisting of hydrogensilses quioxane (HSSQ), methylsilses quioxane (MSSQ), and mixtures thereof.

26. The method according to claim 17, wherein the etching stop layer is formed using a material selected from the group consisting of HDP, USG PE-OXIDE, FSG, BPSG, SiOF, SiON, SiN, and mixtures thereof.

27. The method according to claim 17, wherein the molding layer is formed using a silicon oxycarbide(SiOC) material selected from the group consisting of FSG, Coral, Aurora, Black Diamond, SiLK, LKD, and mixtures thereof.

28. The method according to claim 17, further comprising the step of, after performing the second etching process, performing a third etching process on the protecting layer by using the etching stop layer and the molding layer as an etching mask effective to etch the protecting layer and expose a top surface of the metal interconnection.

29. The method according to claim 17, wherein the third etching process is performed by using an isotropic dry etching technique.

30. A semiconductor device fabricated according to the method of claim 1.

* * * * *